United States Patent
Salter et al.

(10) Patent No.: US 12,415,472 B2
(45) Date of Patent: Sep. 16, 2025

(54) VEHICLE UPFITTER POWER CONNECTION MANAGEMENT STRATEGIES

(71) Applicant: FORD GLOBAL TECHNOLOGIES, LLC, Dearborn, MI (US)

(72) Inventors: Stuart C. Salter, White Lake, MI (US); Brian Grifka, Farmington Hills, MI (US); Stuart Easson, Santa Cruz, CA (US); Todd Ansbacher, Westland, MI (US); David Celinske, Wolverine Lake, MI (US); Brendan F. Diamond, Grosse Pointe, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 194 days.

(21) Appl. No.: 18/463,859

(22) Filed: Sep. 8, 2023

(65) Prior Publication Data
US 2025/0088004 A1    Mar. 13, 2025

(51) Int. Cl.
*G01R 31/08* (2020.01)
*B60R 16/03* (2006.01)

(52) U.S. Cl.
CPC .............. *B60R 16/03* (2013.01); *G01R 31/08* (2013.01)

(58) Field of Classification Search
CPC ................................ B60R 31/08; G01R 31/08
See application file for complete search history.

(56) References Cited

U.S. PATENT DOCUMENTS

| | | | |
|---|---|---|---|
| 8,103,414 B2 | 1/2012 | Boss et al. | |
| 9,020,692 B2 | 4/2015 | Amano et al. | |
| 2006/0167565 A1* | 7/2006 | Katrak | G05B 19/106 700/12 |
| 2016/0112216 A1 | 4/2016 | Sargent et al. | |
| 2019/0222005 A1* | 7/2019 | Steinkamp | B60R 16/0207 |
| 2020/0071894 A1* | 3/2020 | Coyne | B60R 16/023 |
| 2021/0316617 A1* | 10/2021 | Pugh | H02P 9/008 |
| 2022/0111716 A1 | 4/2022 | McKibben et al. | |
| 2022/0402370 A1 | 12/2022 | Pugh | |

FOREIGN PATENT DOCUMENTS

CN         102449572 A       5/2012

* cited by examiner

*Primary Examiner* — Scott Bauer
(74) *Attorney, Agent, or Firm* — Frank Lollo; Brooks Kushman P.C.

(57) ABSTRACT

One or more controllers may, after activation of a vehicle, sequentially pulse field effect transistors of a power distribution module of the vehicle that are connected to inputs of an upfitter power module, and preclude operation of the upfitter power module responsive to, for at least two of the field effect transistors, electrical parameters resulting from the corresponding pulses being reported for a same one of the inputs.

20 Claims, 3 Drawing Sheets

VEHICLE UPFITTER POWER CONNECTION MANAGEMENT STRATEGIES

TECHNICAL FIELD

This disclosure relates to automotive power systems.

BACKGROUND

An automotive vehicle may include an energy storage device, such as a battery. This energy may be made available to electrical and electronic components of the vehicle and outside the vehicle. After-market plowing equipment, for example, may be powered by energy from a battery. Such connections with the battery may be facilitated by a so-called upfitter module.

SUMMARY

A vehicle has a power distribution module including a plurality of field effect transistors and a plurality of corresponding outputs that are each able to be connected with one of a plurality of inputs of an upfitter power module, and one or more controllers that, after activation of the vehicle, sequentially pulse the field effect transistors, and preclude operation of the upfitter power module responsive to, for one of the field effect transistors, electrical parameters resulting from the corresponding pulse being reported for more than one of the inputs.

A method includes, while a plurality of field effect transistors of a power distribution module of a vehicle are passing currents to an upfitter load, sequentially toggling each of the field effect transistors, and responsive to other of the field effect transistors experiencing an increase in current flow during the toggling, deactivating the field effect transistors.

A power control system of a vehicle has one or more controllers that, after activation of the vehicle, sequentially pulse field effect transistors of a power distribution module of the vehicle that are connected to inputs of an upfitter power module, and preclude operation of the upfitter power module responsive to, for at least two of the field effect transistors, electrical parameters resulting from the corresponding pulses being reported for a same one of the inputs.

DETAILED DESCRIPTION

Figure 1:
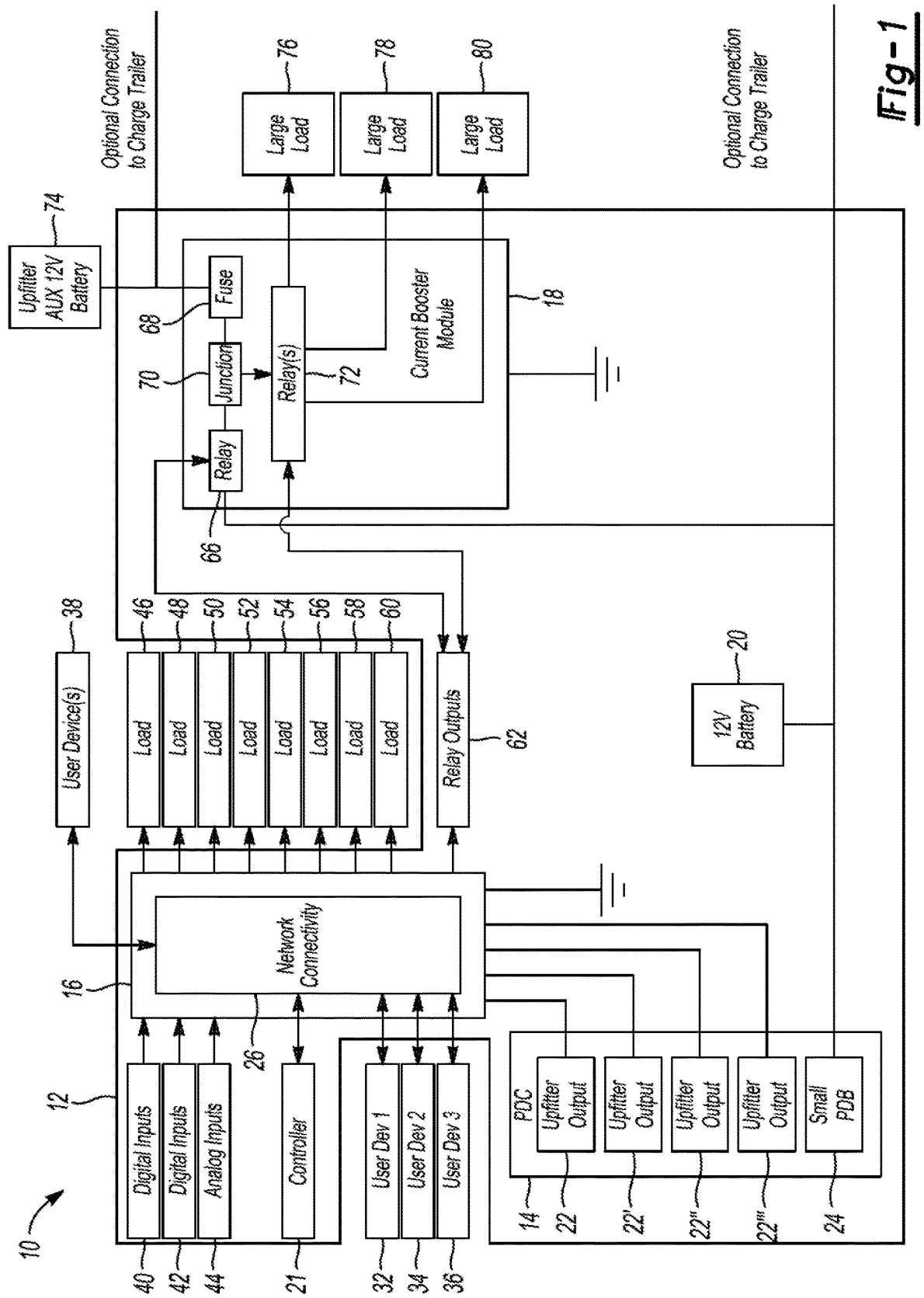
FIGS. 1 through 3 are block diagrams of an automotive power system and upfitter modules/loads.

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

Various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Automotive vehicles typically include a power supply to facilitate functioning of various electrical and electronic components. Several power supply architectures are commonly used in automotive applications, including centralized, decentralized, and hybrid power supply architectures.

Centralized power supply architectures can include a single power supply unit that provides power to all electrical and electronic components in the vehicle. This architecture may be simple and easy to install. In some circumstances however, it may not be suitable for vehicles with high power requirements or those that have different voltage levels for different components.

Decentralized power supply architectures can include multiple power supply units located near the components they power. This architecture may be more flexible than centralized power supply architectures as it permits different voltage levels to be provided to different components. It can also be efficient by reducing the power loss that occurs when power is transmitted over relatively long distances. Decentralized power supply architectures, however, can be more complex with the potential increase in number of connections between power supply units and corresponding components.

Hybrid power supply architectures can be a combination of centralized and decentralized power supply architectures: A central power supply unit provides power to some electrical and electronic components, while other components are powered by decentralized power supply units. This architecture, in certain applications, may provide a balance between flexibility and efficiency.

The use of upfitter power modules can affect the power supply systems of automotive vehicles. Upfitter modules, in some examples, are modular components that can be added to a vehicle to provide additional functionality, such as lighting, power distribution, or electrical power management. An upfitter module that provides lighting and power distribution, for example, can be installed in a vehicle, allowing it to be used as a work vehicle, such as a service truck or construction vehicle. Additionally, upfitter modules can be designed to meet specific requirements, such as providing power to a specific component or group of components.

Several factors can be considered when selecting an upfitter module, including the power requirements of the component or group of components that the upfitter module will power, the voltage level required, and the environmental conditions in which the upfitter module will be used.

Some upfitter modules may not support medium or high current applications, may not be expandable, may not provide feedback to the vehicle to manage effects of high current loads, and/or do not support added video cameras, etc.

Certain upfitter modules have taken the form of switches mounted in an over-head compartment and relays in an add-on engine compartment power distribution box. In some arrangements, wires are fed to the engine compartment power distribution box, but not connected to relays. Screens may be used to support touch drive of field effect transistors that control loads.

Referring to FIG. 1, an example automotive power system 10 for a vehicle 12 includes a power distribution center 14, an upfitter module 16, an upfitter current booster module 18, a 12V battery 20, and a controller 21.

The power distribution center 14 includes a plurality of upfitter outputs 22, 22', 22", 22''' (e.g., two 20 A field effect transistor controlled outputs and two 30 A field effect transistor controlled outputs, four 25 A field effect transistor controlled outputs, etc.) and an interconnector power distribution box 24 (e.g., a 200 A field effect transistor controlled output). The respective ratings of these field effect transistors thus define what their limits are for current flow therethrough. The upfitter outputs 22, 22', 22", 22''' are connected with the upfitter module 16 at corresponding inputs. The interconnector power distribution box 24 is connected with the 12V battery 20. Other arrangements, with differing numbers of outputs, etc., are of course also contemplated.

The upfitter module 16 is grounded and includes network connectivity 26, which is connected with a plurality of user devices 32, 34, 36, 38. The upfitter module 16 is configured to receive digital inputs 40, 42 and an analog input 44, and to provide current to loads 46, 48, 50, 52, 54, 56, 58, 60 in this example. The upfitter module 16 is further configured to provide current to relay outputs 62. Multiple such upfitter modules can be so connected (e.g., daisy chained) to obtain as many inputs/outputs as necessary as mentioned above.

The upfitter current booster module 18 is grounded and includes a relay 66, a fuse 68, a junction 70, and a plurality of relays 72. The junction 70 is connected between the relay 66, fuse 68, and relays 72. The relay 66 is connected with the interconnector power distribution box 24. The fuse 68 is connected with an auxiliary 12V battery 74. The relays 72 are configured to provide current to a plurality of large loads 76, 78, 80.

In the above described high current architecture, the upfitter current booster module 18, which can be stamped track relays controlled by the upfitter module 16, is powered from a power distribution center output different from the upfitter module 16. All the expansion modules receive their power from a 100 A output from the power distribution center 14. As current usage approaches the 100 A limit, the operator can be notified (e.g., by screen or phone-as-a-key) via, for example, alerts generated and forwarded by the controller 21. The upfitter module 16 tracks and reports on loads to the controller 21, which can facilitate notification of the operator.

Optional connections to a charge trailer are shown for the 200 A output. Communication with the charge trailer can be, for example, controller area network or Ethernet. This allows the upfitter to exceed the 200 A continuous power distribution center limits.

Figure 2:
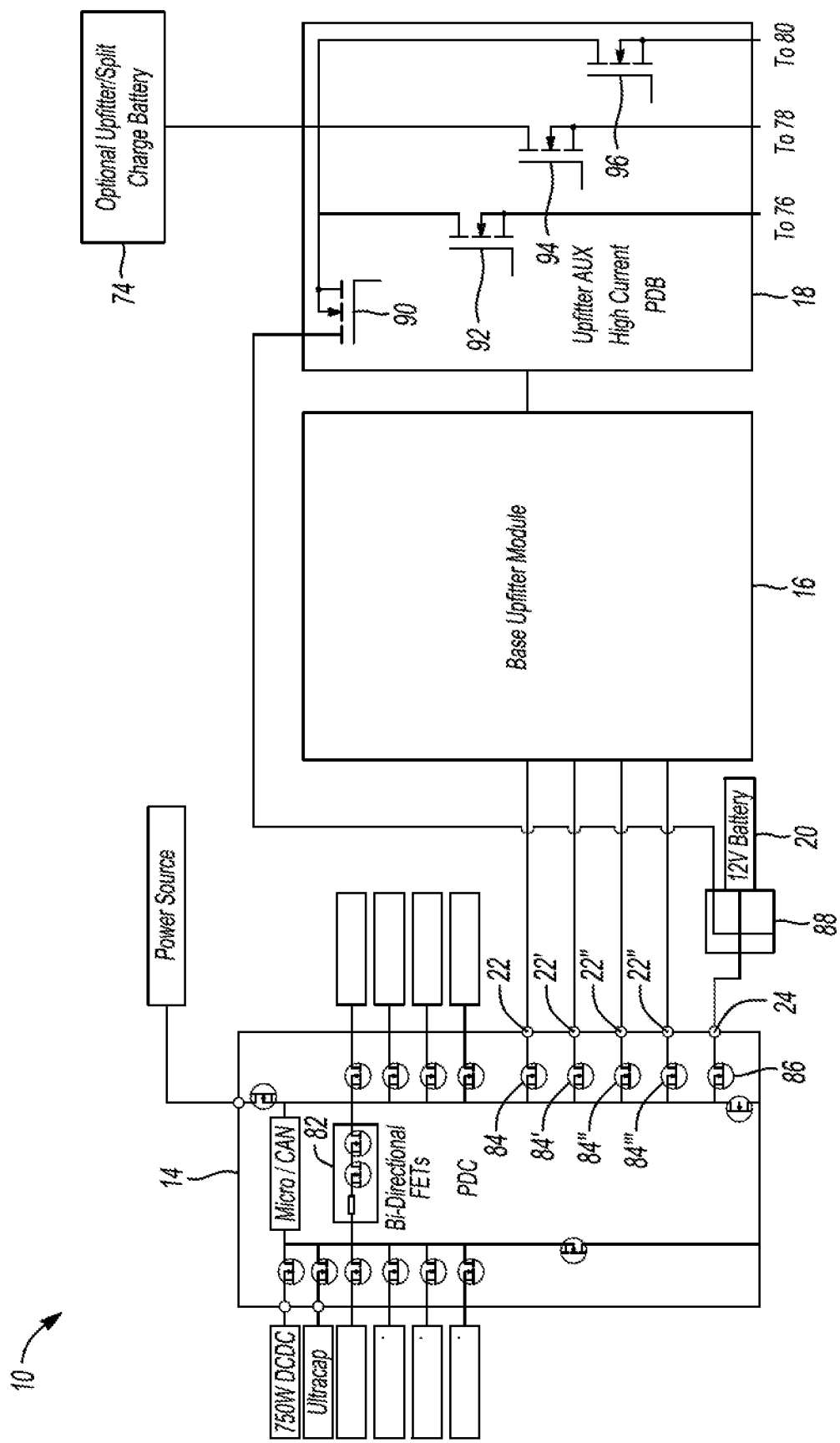

Referring to FIG. 2, the power distribution center 14 further includes, in this example, a plurality of bidirectional field effect transistors 82, 100 A (in the aggregate) capable field effect transistors 84, 84', 84", 84''' (continuous), and a 200 A capable field effect transistor 86 (continuous). The field effect transistors 84, 84', 84", 84''' are respectively connected between the bidirectional field effect transistors 82 and upfitter outputs 22, 22', 22", 22'''. The 200 A capable field effect transistor 86 is connected between the bidirectional field effect transistors 82 and the interconnector power distribution box 24. The power distribution center 14 also includes other field effect transistors connected between the bidirectional field effect transistors 82 and other vehicle components (e.g., a DC/DC converter, an ultra-capacitor, other power sources, etc.).

The automotive power system 10 may further include a power distribution box 88. The power distribution box 88 may be packaged on top of or next to the 12V battery 20. It may serve as an interconnection point for the upfitter current booster module 18, 12V battery 20, interconnector power distribution box 24, and any jump start post.

The upfitter current booster module 18 further includes a plurality of field effect transistors 90, 92, 94, 96. The field effect transistor 90 is connected between the power distribution box 88 and field effect transistors 92, 94, 96. The field effect transistor 92 is connected between the large load 76 and field effect transistor 90. The field effect transistor 94 is connected between the auxiliary 12V battery 74, large load 78, and field effect transistor 90. The field effect transistor 96 is connected between the large load 80 and field effect transistor 90. The field effect transistor 90 is thus arranged to isolate the large load 76, 78, 90 from negative transient loads. These loads may be some of the loads that are assigned priority in the event shedding becomes necessary as described above.

To achieve the 100 A continuous power, in the aggregate, from the upfitter outputs 22, 22', 22", 22''', they should not be connected together in parallel as they are configured to work separately. That is, if the field effect transistors 84, 84', 84", 84''' are connected in parallel, the full 100 A in the aggregate output may not be achieved, and there may be unbalanced current throughput for each.

Because the upfitter module 16 is configured to measure corresponding voltages via, for example, common voltage sensors at the inputs, upon the vehicle 12 being activated and/or before operation of the upfitter module 16 is permitted (enablement), each of the field effect transistors 84, 84', 84", 84''' may be individually turned on/off at the command of the controller 21 while voltages at the inputs to the upfitter module 16 are checked to determine if any lines have been tied together. As just mentioned, these checks can include pulsing (turning on/off or injecting a small current pulse) each of the field effect transistors 84, 84', 84", 84'''. The controller 21 can then detect, for each of the field effect transistors 84, 84', 84", 84''', whether voltages at multiple of the inputs are detected (one output to many inputs) based on data reported by the upfitter module 16. The controller 21 can also detect, for two or more of the field effect transistors 84, 84', 84", 84''', whether voltages at a same one of the inputs is detected (many outputs to one input). If so, the controller 21 may preclude operation of the upfitter module 16 (e.g., prevent the upfitter module 16 from facilitating power flow) and/or alert a user via, for example, an infotainment screen, to reconnect so as to not have parallel connections. If not (i.e., voltage is detected at only one of the inputs for a pulsing of a given one of the field effect transistors 84, 84', 84", 84'''), the controller 21 may confirm the power distribution center connections are appropriately connected (not connected in parallel) to the upfitter module 16, and permit operation of the same.

Figure 3:
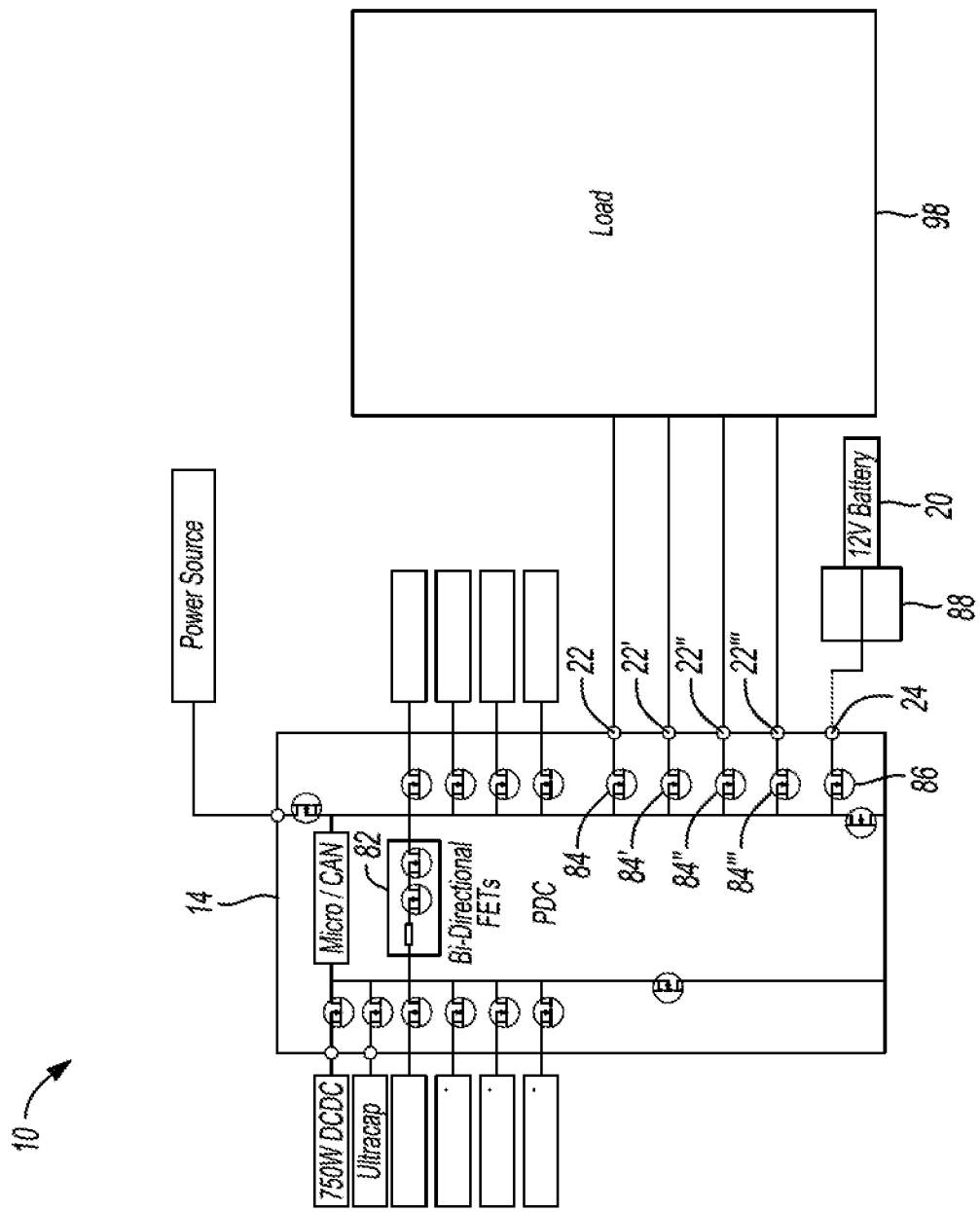

Referring to FIG. 3, there may be circumstances in which the field effect transistors 84, 84', 84", 84''' are directly powering a load 98. In such circumstances, electrical parameter feedback (e.g., voltage measurements) from the load 98 may be unavailable. If the field effect transistors 84, 84', 84", 84''' are connected in parallel and powering the load 98 however, turning off one of the field effect transistors 84, 84', 84", 84''' would result in a current rise in other of the field effect transistors 84, 84', 84", 84'''. Typical current sensors associated with the field effect transistors 84, 84', 84", 84''' can be used to measure corresponding currents therethrough after each of the field effect transistors 84, 84', 84", 84''' has been toggled off at the command of the controller 21. This current information may be reported to the controller 21. If the same detects the current rise responsive to the toggling, the controller 21 may disable (deactivate) particular ones of field effect transistors 84, 84', 84", 84''' determined to be connected in parallel to preclude power flow therethrough. The controller 21 may further issue alerts/instructions as mentioned above to the user to reconnect the load 98 and not have parallel connections, etc.

Alternatively, if the controller 21 detects the current rise responsive to the toggling, it may further examine whether, for those of the field effect transistors 84, 84', 84", 84''' determined to be connected in parallel, a difference in current magnitudes exceeds some calibrated threshold, which can be determined via testing, simulation etc. If yes, the controller 21 may disable the subject field effect transistors 84, 84', 84", 84'''. If no, the controller 21 may maintain operation of the field effect transistors.

If the current magnitudes for each path are relatively close in magnitude (e.g., less than the calibrated threshold), this will indicate that the field effect transistor resistances/impedances are also relatively close in value and the power distribution center/upfitter module capability will be minimally affected. If this check indicates a difference in current/ impedance (e.g., greater than the calibrated threshold), this will indicate a derated power distribution center/upfitter module capability. Based on a determination that the connections are being run in parallel, the controller 21 may also communicate to the user this arrangement could result in reduced capability and inform the user of the expected performance reduction based on the measurements. The controller 21 can also instruct the user to rewire the upfitter devices based on recommendations and/or connect the installer to a dealership technician.

If any loads are found to be tied together as mentioned above, an alert may be displayed regarding non-optimal connection to power, and/or based on the current flowing through each of the field effect transistors 84, 84', 84", 84''', an estimate be generated of the full power that will be reached given the connection configuration.

If the field effect transistors 84, 84', 84", 84''' do reach the current limit in a parallel connected situation (typically, one will reach the current limit first then be shut down immediately followed by a second to reach the current limit then be shut down, and so on), a diagnostic code can be stored and the maximum current before shutting down at the time the first of the field effect transistors 84, 84', 84", 84''' tripped can be shown for all field effect transistors connected in parallel.

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims. The words used in the specification are words of description rather than limitation, and it is understood that various changes may be made without departing from the spirit and scope of these disclosed materials. The terms "controller" and "controllers," for example, can be used interchangeably herein as the functionality of a controller can be distributed across several controllers/modules, which may all communicate via standard techniques.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to strength, durability, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle comprising:
a power distribution module including a plurality of field effect transistors and a plurality of corresponding outputs that are each configured to be connected with one of a plurality of inputs of an upfitter power module; and
one or more controllers programmed to, after activation of the vehicle, sequentially pulse the field effect transistors, and preclude operation of the upfitter power module responsive to, for one of the field effect transistors, electrical parameters resulting from the corresponding pulse being reported for more than one of the inputs.

2. The vehicle of claim 1, wherein the one or more controllers are further programmed to, after activation of the vehicle, preclude operation of the upfitter power module responsive to, for two or more of the field effect transistors, electrical parameters resulting from the corresponding pulses being reported for a same one of the inputs.

3. The vehicle of claim 1, wherein the one or more controllers are further programmed to enable of the upfitter power module responsive to, for each of the field effect transistors, an electrical parameter resulting from the pulse being reported for only one of the inputs.

4. The vehicle of claim 1, wherein the one or more controllers are further programmed to, while the field effect transistors are passing currents, sequentially toggle each of the field effect transistors, and responsive to other of the field effect transistors experiencing an increase in current flow during the toggle, deactivate the field effect transistors.

5. The vehicle of claim 1, wherein the one or more controllers are further programmed to, while the field effect transistors are passing currents, sequentially toggle each of the field effect transistors, and responsive to other of the field effect transistors experiencing an increase in current flow during the toggle and a difference in magnitudes of the currents exceeding a threshold, deactivate the field effect transistors.

6. The vehicle of claim 5, wherein the one or more controllers are further programmed to, while the field effect transistors are passing currents, and responsive to other of the field effect transistors experiencing an increase in current flow during the toggle and the difference being less than the threshold, maintain operation of the field effect transistors.

7. The vehicle of claim 1, wherein the one or more controllers are further programmed to generate an alert responsive to, for one of the field effect transistors, the electrical parameters resulting from the corresponding pulse being reported for more than one of the inputs.

8. The vehicle of claim 1, wherein the electrical parameters are voltages.

9. A method comprising:
while a plurality of field effect transistors of a power distribution module of a vehicle are passing currents to an upfitter load, sequentially toggling each of the field effect transistors, and responsive to other of the field effect transistors experiencing an increase in current flow during the toggling, deactivating the field effect transistors.

10. The method of claim 9 further comprising, while the field effect transistors are connected with at least one input of an upfitter power module, sequentially pulsing the field effect transistors, and responsive to, for one of the field effect transistors, electrical parameters resulting from the corresponding pulsing being reported for more than one of the inputs, precluding operation of the upfitter power module.

11. The method of claim 10 further comprising, responsive to, for each of the field effect transistors, an electrical parameter resulting from the pulsing being reported for only one of the inputs, enabling the upfitter power module.

12. The method of claim 9 further comprising, while the field effect transistors are connected with at least one input of an upfitter power module, sequentially pulsing the field effect transistors, and responsive to, for two or more of the field effect transistors, electrical parameters resulting from the corresponding pulsing being reported for a same one of the inputs, precluding operation of the upfitter power module.

13. The method of claim 12 further comprising, responsive to, for each of the field effect transistors, an electrical parameter resulting from the pulsing being reported for only one of the inputs, enabling the upfitter power module.

14. The method of claim 9 further comprising, responsive to, for the one of the field effect transistors, electrical parameters resulting from the corresponding pulsing being reported for more than one of the inputs, generating an alert.

15. A power control system of a vehicle comprising:
one or more controllers programmed to, after activation of the vehicle, sequentially pulse field effect transistors of a power distribution module of the vehicle that are connected to inputs of an upfitter power module, and preclude operation of the upfitter power module responsive to, for at least two of the field effect transistors, electrical parameters resulting from the corresponding pulses being reported for a same one of the inputs.

16. The power control system of claim 15, wherein the one or more controllers are further programmed to preclude operation of the upfitter power module responsive to, for one of the field effect transistors, electrical parameters resulting from the corresponding pulse being reported for more than one of the inputs.

17. The power control system of claim 15, wherein the one or more controllers are further programmed to enable the upfitter power module responsive to, for each of the field effect transistors, an electrical parameter resulting from the pulse being reported for only one of the inputs.

18. The power control system of claim 15, wherein the one or more controllers are further programmed to, while the field effect transistors are passing currents, sequentially toggle each of the field effect transistors, and responsive to other of the field effect transistors experiencing an increase in current flow during the toggle, deactivate the field effect transistors.

19. The power control system of claim 15, wherein the one or more controllers are further programmed to generate an alert responsive to, for at least two of the field effect transistors, electrical parameters resulting from the corresponding pulses being reported for the same one of the inputs.

20. The power control system of claim 15, wherein the electrical parameters are voltages.

* * * * *